United States Patent
Tzuang

[11] Patent Number: 5,783,847
[45] Date of Patent: Jul. 21, 1998

[54] DUAL-MODE MICROMETER/MILLIMETER WAVE INTEGRATED CIRCUIT PACKAGE

[75] Inventor: Ching-Kuang Tzuang, Department of Communication Engineering, National Chiao Tung University, 1001 Ta Hsueh Road, Hsinchu, Taiwan

[73] Assignee: Ching-Kuang Tzuang, Taiwan

[21] Appl. No.: 912,693

[22] Filed: Aug. 18, 1997

[30] Foreign Application Priority Data

Aug. 14, 1997 [TW] Taiwan ................... 86104743

[51] Int. Cl.[6] .................. H01L 29/80; H01L 31/112; H01L 23/52
[52] U.S. Cl. ........................... 257/275; 257/691
[58] Field of Search ................... 257/275, 691

[56] References Cited

U.S. PATENT DOCUMENTS 5,229,639  7/1993  Hansen et al.
5,235,208  8/1993  Katoh.
5,359,224  10/1994  Heinon et al.
5,394,008  2/1995  Ito et al.
5,679,979  10/1997  Weingand.

FOREIGN PATENT DOCUMENTS

62-115783  5/1987  Japan.
2-180062  7/1990  Japan.
6-5881  1/1994  Japan.

*Primary Examiner*—Stephen Meier
*Attorney, Agent, or Firm*—Cushman Darby & Cushman IP Group of Pillsbury Madison & Sutro LLP

[57] ABSTRACT

A dual-mode microwave/millimeter wave integrated circuit package with low cost, high operating frequency, quick cooling, and high reliability is disclosed. More particularly, the package structure of the invention supports both microstrip and coplanar waveguide operation modes, which cannot be accomplished by any prior microwave integrated circuit package structures.

9 Claims, 12 Drawing Sheets

DUAL-MODE MICROMETER/MILLIMETER WAVE INTEGRATED CIRCUIT PACKAGE

BACKGROUND OF THE INVENTION

1. Field of the Invention

The invention relates to a dual-mode microwave/millimeter wave integrated circuit (IC) package, and more particularly, to a microwave/millimeter wave IC package that supports both microstrip operation mode and coplanar waveguide operation mode.

2. Description of the Related Art

The microstrip is a popular waveguide element in microwave IC design during the last 30 years; however, the coplanar waveguide technology also makes rapid progress in recent years. Either mode has its own advantages and disadvantages, for instance, the microstrip mode is easily operated for its being single mode while signals propagating in the coplanar waveguide mode do not attenuate as much as in the case of microstrip mode and connecting the coplanar waveguide to ground is easier. Operation of the coplanar waveguide is comparatively more difficult since the coplanar waveguide supports multiple modes.

Figure 10:
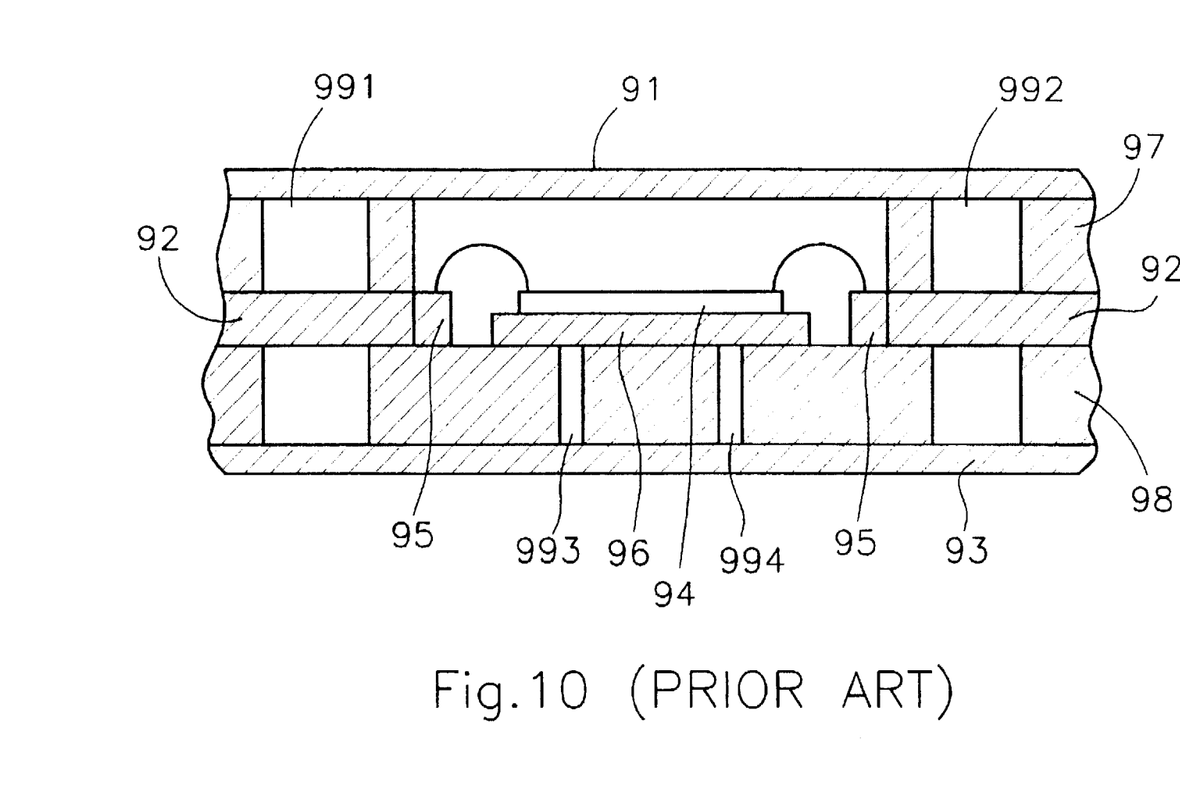
FIG. 10 shows the structure of a prior microwave IC package.
Figure 11:
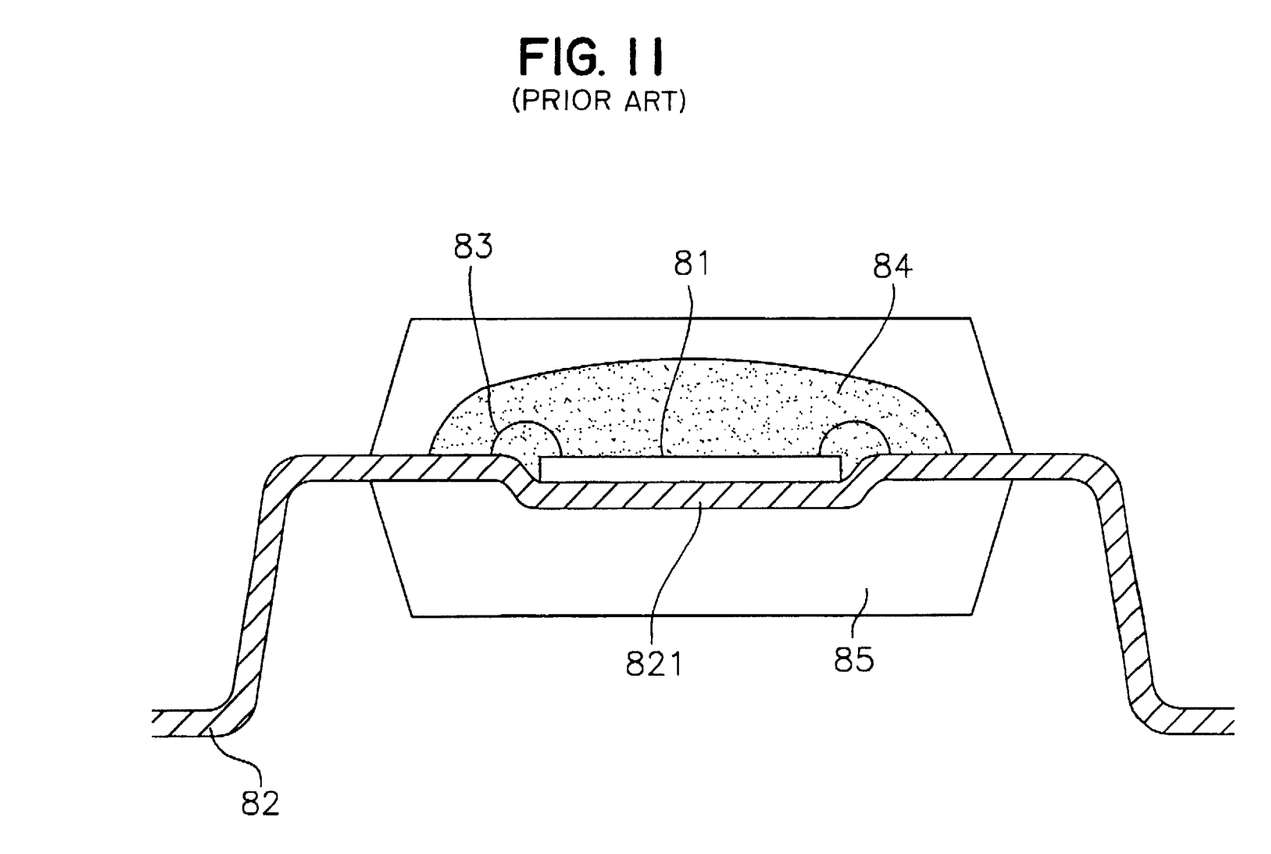
FIG. 11 shows the structure of another prior microwave IC package.
Figure 12:
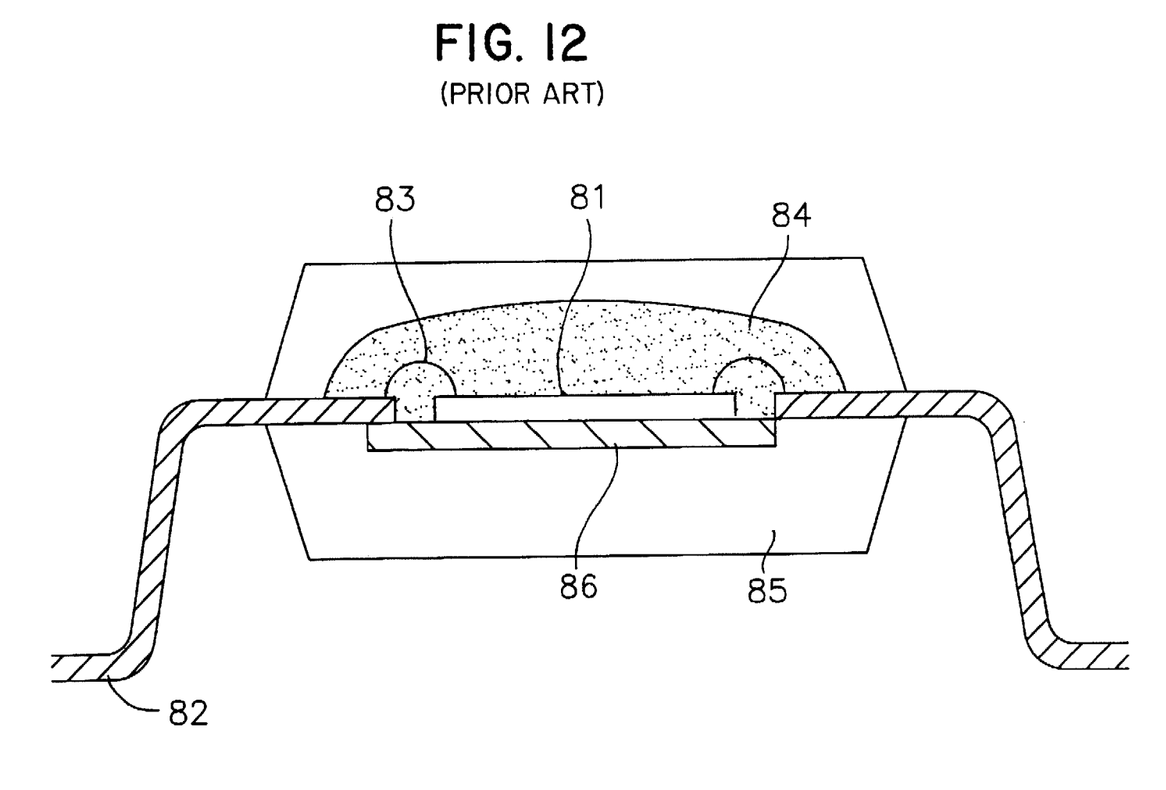
FIG. 12 shows the structure of yet another prior microwave IC package.

FIG. 10 schematically shows a prior microwave IC package structure disclosed in the U.S. Pat. No. 5,235,208 which includes: three-layer base composed of an upper metal layer 91, a middle metal layer 92, and a lower metal layer 93 (the same concept can be applied to bases having more than three layers), an IC chip 94, a transmission line 95, an IC chip solder portion 96, an upper dielectric layer 97, a lower dielectric layer 98, and via holes 991–994. The multi-layer base forms a transimission medium, or a conductor-backed coplanar waveguide, to connect to the IC chip 94. Absence of lead frame as shown in FIGS. 11 and 12 in the IC package of FIG. 10 reduces the inductance of the whole package structure, therefore, the IC package can operate at considerably high frequency (higher than 20 GHz according to the document). While the disadvantage is that desiccation of the package is accomplished by hermetical sealing which makes the cost higher than the cost of SOIC (small outline integrated circuit) package, thus the package has been gradually replaced by SOIC package for most commercial applications.

The SOIC packaging technique is now widely utilized, and the structure is shown in FIG. 11. The point is to adhere the IC chip 81 onto the paddle 821 of the lead frame 82 by surface mounting, to punch bond wire 83, and then to fix with encapsulant, finally to shape by injection mold 85. An advantage is that the package is protected against humidity and dust, which adversely affect the electrical characteristics of the package, by the injection mold 85. Thus the reliability of the package is assured. Although the inductance caused by the lead frame or the bond wire decreases as the IC package is downsized, the distance between the leads of the lead frame reduces correspondingly, which, however, makes substantial electromagnetic coupling.

FIG. 12 shows another SOIC package structure disclosed by Marc Gomes-Casseses and Philip M. Fabis of late years, which is quite similar to the conventional SOIC package structure shown in FIG. 11 but the paddle 821 of the lead frame 82 is replaced with an artificial diamond base 86 to improve the heat-conducting effect and decrease the transmission loss. This package structure is applicable to high power microwave IC.

These aforesaid conventional packaging techniques cannot support both microstrip/coplanar waveguide operation modes simultaneously, and besides, they have the following disadvantages. As shown in FIG. 10, the package is not a surface mounting type, which makes the fabrication difficult and the cost expensive. As the operating frequency rises, energy loss resulting from the emitted electromagnetic energy of the package shown in FIG. 11 increases. This adversely affects the resulting electrical performance. Although the one shown in FIG. 12 has a lower transmission loss, incorporating the artificial diamond increases the cost.

Therefore, one object of the invention is to provide a low cost packaging technique, similar to the SOIC packaging technique, in which the encapsulant is utilized for fixing and the injection mold is utilized as exterior cover (refer to the 84 and 85 shown in FIG. 12 or 13), thus rendering high reliability. Via holes (refer to 991, 992, 993, and 994 of FIG. 10) in the package structure according to the present invention contribute to transfer heat to the surroundings. Besides, since the whole package structure is designed based on waveguide structure, the operating frequency is quite high; operating frequency higher than 30 GHz can be easily achieved in a typical condition when miniaturization is not necessary. In particular, the package structure of the present invention supports both microstrip operation mode and coplanar waveguide operation mode which cannot be accomplished in any prior microwave IC package structures.

SUMMARY OF THE INVENTION

Figure 1:
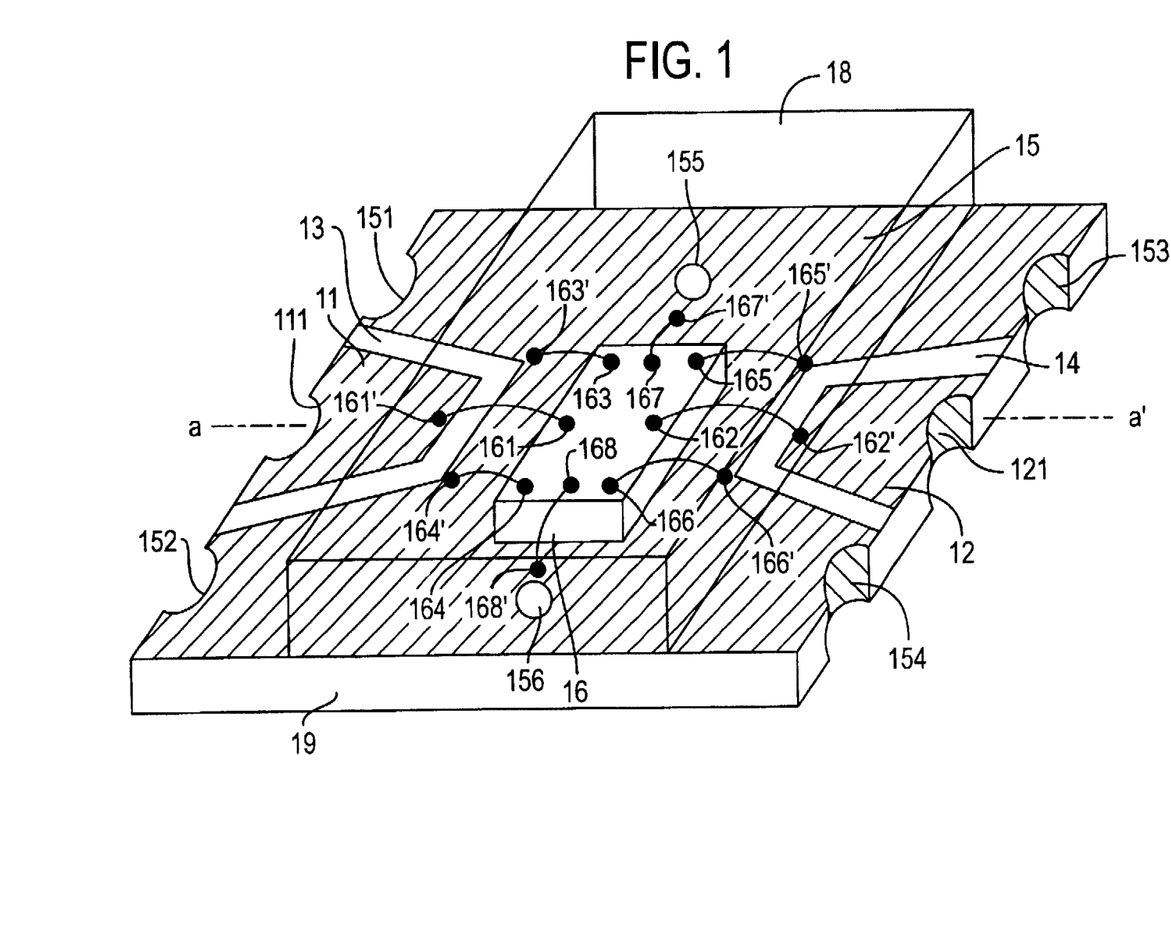
FIG. 1 is a top view showing the dual-mode microwave/millimeter wave IC package of the present invention.
Figure 2:
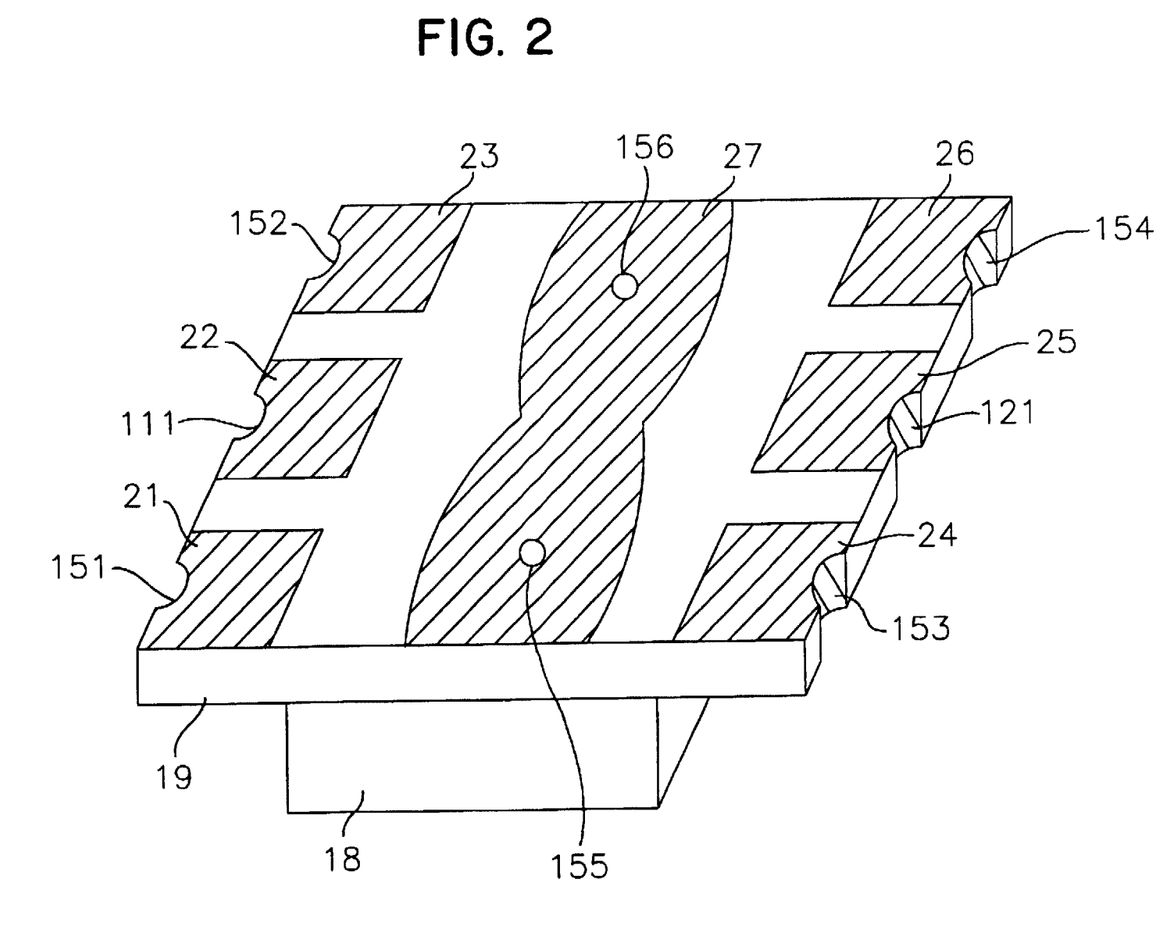
FIG. 2 is a bottom view showing the dual-mode microwave/millimeter wave IC package of the present invention.
Figure 3:
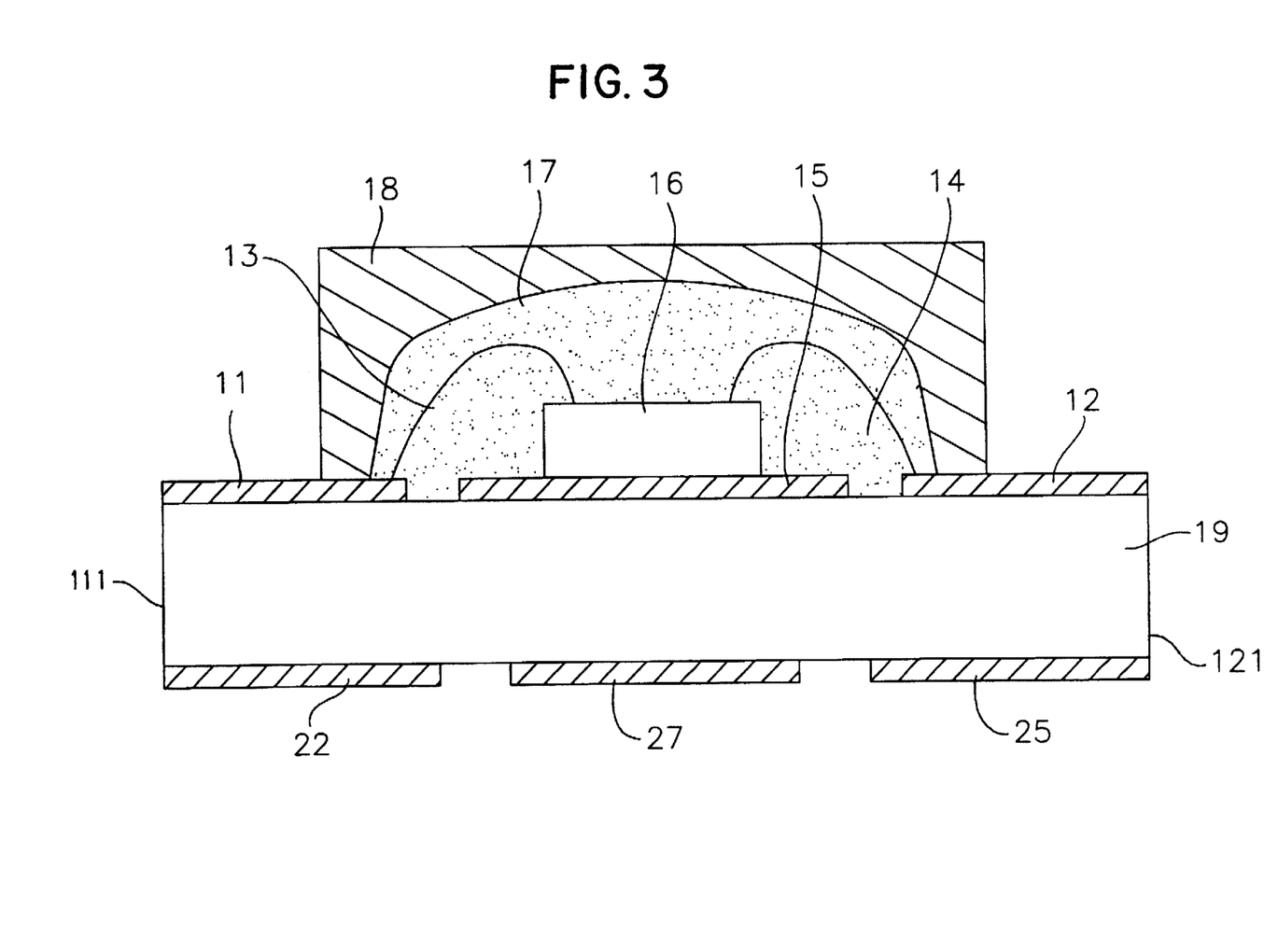
FIG. 3 is a sectional view taken along the line a-a' of FIG. 1 showing the dual-mode microwave/millimeter wave IC package of the present invention.

The dual-mode microwave/millimeter wave IC package structure of the invention can be illustrated by the top view shown in FIG. 1, the bottom view shown in FIG. 2, and the sectional view shown in FIG. 3. The top view in FIG. 1 shows that the top surface of the invention includes: an upper left metal strip 11 and an upper right metal strip 12, a left insulating strip 13 and a right insulating strip 14, an upper middle metal area 15, an IC chip 16, an encapsulant 17 and an injection mold 18.

The upper left metal strip 11 and the upper right metal strip 12 are distributed in zonal area which extend a distance from the substantially central site of the left and right edges of the top surface toward the center of the top surface respectively; besides, the upper left metal strip 11 and the upper right metal strip 12 are connected to the bottom surface through the via holes 111 and 121 positioned at the left and right edge of the top surface, respectively.

The left insulating strip 13 and the right insulating strip 14 are located outside the upper left metal strip 11 and upper right metal strip 12, both of them are spindling and with tiny area.

The upper middle metal area 15 is located on the region of the top surface other than the upper left metal strip 11, the upper right metal strip 12, the left insulating strip 13, and the right insulating strip 14; besides, the upper middle metal area 15 is connected to the bottom surface through the via holes 151~156 which are positioned in the upper and lower sides of left edge of the top surface, the upper and lower sides of right edge of the top surface, and the substantially central portion in horizontal direction, respectively.

The IC chip 16 is placed on the substantially central site, the complete area covered by the IC chip 16 falls into the upper middle metal area 15 without blanketing any via hole, the signal terminals 161~162 and the ground terminals 163~168 are located on the top surface of the chip 16, and these terminals are connected to the upper left metal strip 11, upper right metal strip 12, and upper middle metal area 15 through a plurality of bond wires, respectively.

The encapsulant 17 (refer to FIG. 3) covers the IC chip 16 and the bond wires to fix the IC chip 16.

The injection mold 18 is formed above the encapsulant 17; besides, a substrate 19 is placed between the top surface and the bottom surface.

The bottom view in FIG. 2 shows that the bottom surface includes: lower left metal strips 21–23, lower right metal strips 24–26, and a lower middle metal area 27.

The lower left metal strips 21–23 are distributed in zonal areas which extend a distance from the lower, middle, and upper side of the left edge of the bottom surface to the right side of the bottom surface, these metal strips are connected to the upper middle metal area 15, the upper left metal strip 11, and the upper middle metal area 15 through via the holes 151, 111, and 152, respectively.

The lower right metal strips 24–26 are distributed in zonal areas which extend a distance from the lower, middle, and upper side of the right edge of the bottom surface to the left side of the bottom surface, these metal strips are connected to the upper middle metal area 15, the upper right metal strip 12, and the upper middle metal area 15 through the via holes 153, 121, and 154, respectively.

The lower middle metal area 27 is located on the substantially central site between the upper edge and the lower edge, and is connected to the upper middle metal area 15 through the via holes 156 and 155.

DESCRIPTION OF THE PREFERRED EMBODIMENTS

The IC package according to the present invention is connected to the exterior microwave/millimeter wave IC in a surface mounting manner, and is adapted to the development of mass production technology. Therefore, when exterior coupling circuits are designed as microstrip mode, operation can be proceeded under microstrip mode by using the IC package according to the present invention.

Figure 4:
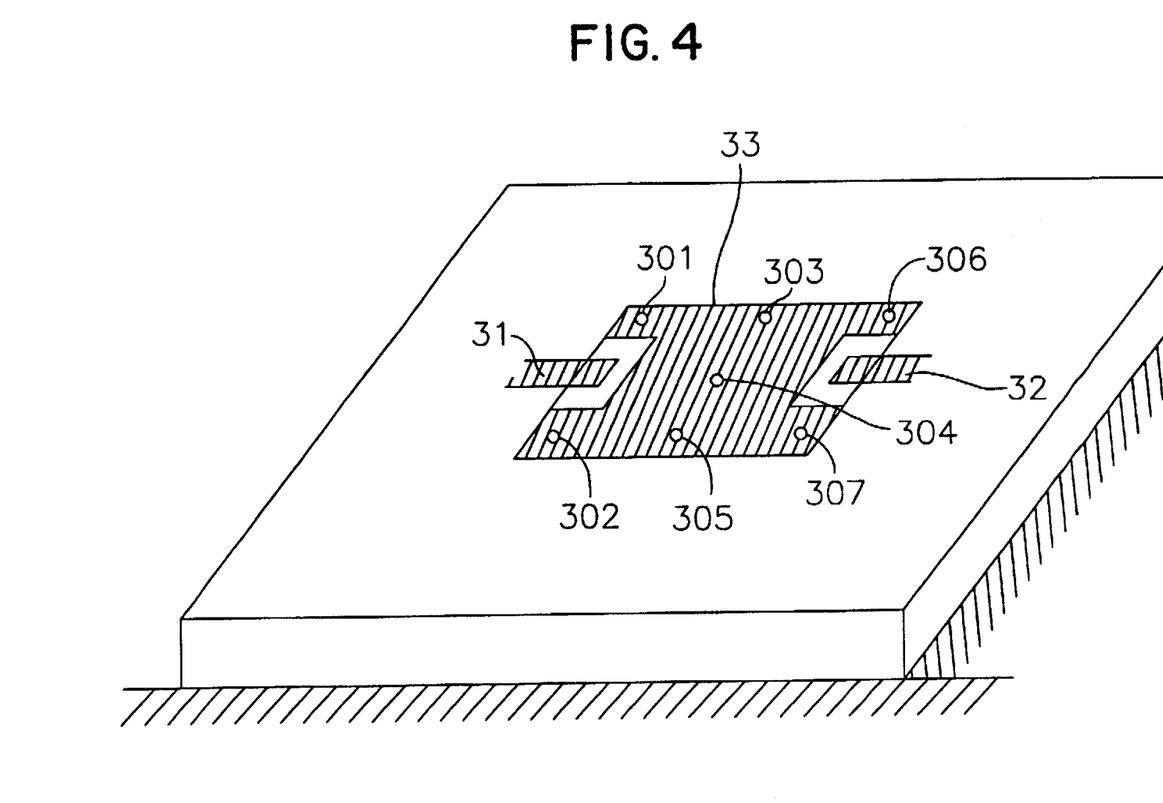
Fig. 4 shows a user circuit board under the microstrip mode.

Under the situation, it can be considered that the IC package according to the present invention shown in FIG. 1 is placed on the exterior circuit shown in FIG. 4. Since the microstrip 31 contacts with the metal strip 22 of FIG. 2 directly (by soldering, for example), microwave signal vertically ascends from the metal strip 22 (FIG. 2) to the metal strip 11 (FIG. 1) through the via hole 111 when input signals are introduced from the exterior microwave circuit with microstrip 31 (FIG. 4). Reverse ground return current supporting microstrip mode flows from the system ground (30 in FIG. 4) through the via holes 301–307 to user substrate ground 33, and further ascends to the metal area 15 by the metal strips 21, 23, 24, 26, and the metal area 27, which contacts with it, through the corresponding via holes 151, 152, 153, 154, and 155, 156, respectively. Therefore, the ground return current of the system flows to middle metal area 15 of the IC package smoothly wherein the metal area 15 is the ground surface of the IC 16.

The arrangement of bonding wires is discussed hereinafter. Microwave signal flows from front edge 161' of the metal strip 11 to the signal input terminal 161 of the IC 16 through one or more bond wires. The bond wires, ground surface 15, and the air or other insulating materials between them, together form a waveguide which is similar to the microstrip. Since the gap between the metal strip 11 and the ground surface 15 is quite small, the microstrip structure formed by the bond wire 161-161' leads to only a slight discontinuity. Bond wire 162-162' is similar to the bond wire 161-161' and thus the description is omitted. Bond wires which are outwardly connected from ground terminals 163–168 of the IC 16 can be classfied into two categories:

(1) Bond wires 163-163', 164-164', 165-165', and 166-166': These bond wires connect the points 163, 164, 165, and 166 to the points 163', 164', 165', and 166', respectively. The points 163' and 164' are the nearest points from point 161' (located on the front end of metal strip 11) and the points 165' and 166' are the nearest points from point 162' (located on the front end of metal strip 12);

(2) Bond wires 167-167' and 168-168': These bond wires connect the points 167 and 168 to the points 167' and 168', respectively. The 167' and 168' are located on the metal area 15 which is the nearest from 167 and 168, respectively.

As described above, a substantially continuous and complete microstrip transmission line system is formed from the signal input terminal when the microstrip operation mode is used, the excellent ground surface 15 and two different categories of ground wires together with the IC 16 establish an excellent ground loop.

Figure 5:
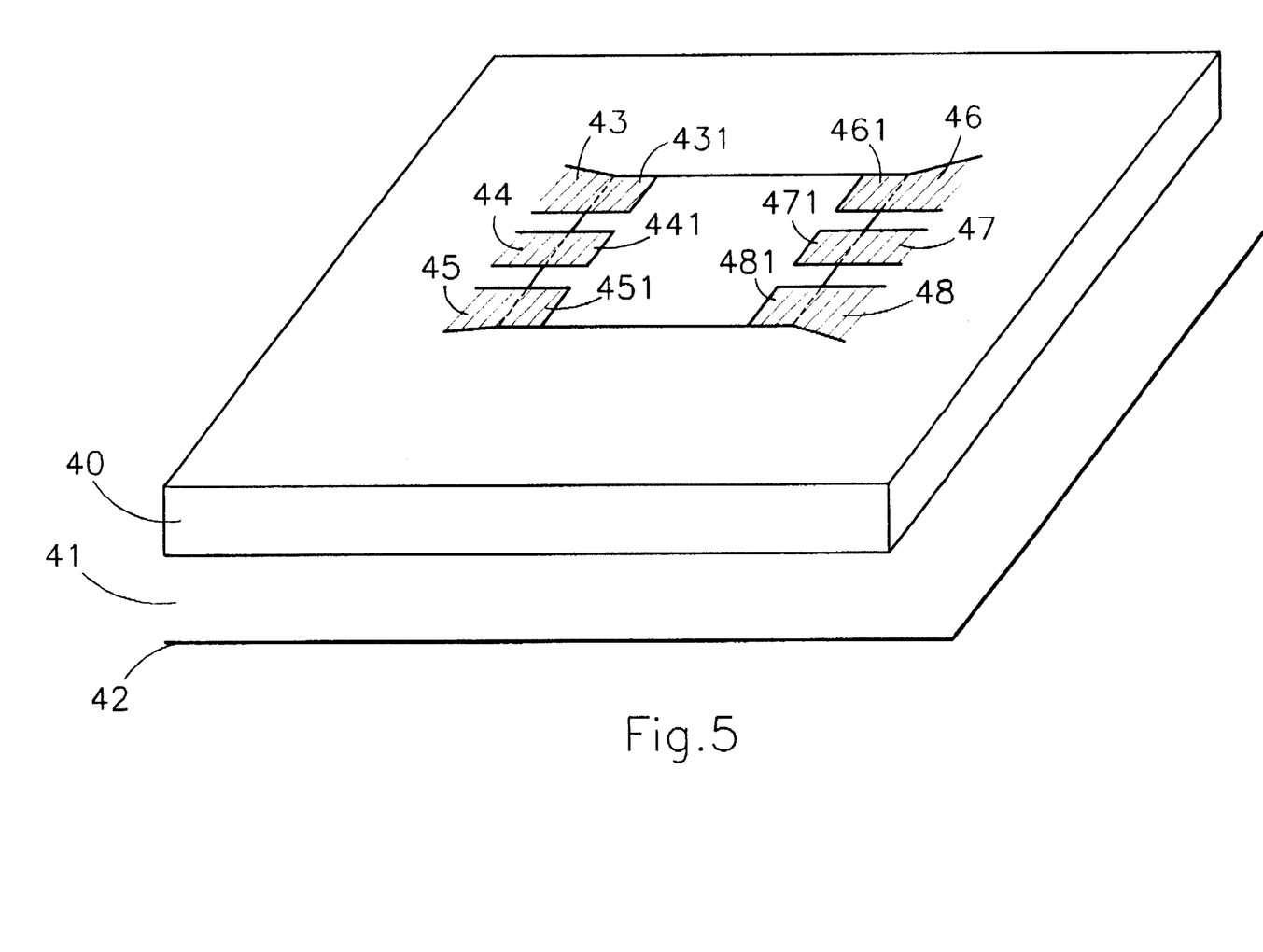
FIG. 5 shows the user circuit board under the coplanar waveguide mode.

On the other hand, when the external circuit is composed of the coplanar waveguide, the external circuit can be illustrated by FIG. 5, which includes: a substrate 40, a metal plate 42, a medium layer 41, and metal strips 43–48. The medium layer 41 can be filled with dielectric material, or kept empty such that the substrate 40 is suspended above the metal plate 42 to form a suspended coplanar waveguide; or the substrate 40 may be immediately adjacent to the metal plate 42 to form a conductor-backed coplanar waveguide.

The IC package according to the present invention can accept the signals at the input or output of both suspended coplanar waveguide and conductor-backed coplanar waveguide, here the suspended coplanar waveguide is used for illustration: in FIG. 5, signals inputting to and outputting from the ground-signal-ground coplanar waveguide formed by coplanar metal strips 43-44-45 and 46-47-48 are through the substrate 40. Ends 431-441-451 and 461-471-481 of these coplanar metal strips contact with different portions 21-22-23 and 24-25-26 of the bottom surface of the IC package according to the present invention (FIG. 2) by, for example, soldering. Input signals to the coplanar waveguide pass through 441 (FIG. 5) and ascend to the metal strip 11 (FIG. 1) via the metal strip 22 and the via hole 111 (FIG. 2). At the same time, the reverse ground current of the coplanar waveguide ascends and enters the whole ground surface 15 through the via holes 151 and 152 after contacting with the metal strips 21 and 23 of bottom surface of the IC package by 431 and 451 (FIG. 5).

At this moment, wave's propagation direction of the coplanar waveguide changes from vertical to horizontal, while most of the electromagnetic energy still spreads between signal line-metal strip 11 and ground line-ground surface 15. The resulting horizontal coplanar waveguide progresses until the front edge (the portion near the center of the left insulating strip 13) of metal strip 11, then the propagated wave enters the signal input terminal 161 of IC 16 via the bond wire 161-161'. The points 163' and 164' of ground surface 15 connect to the reference ground points 163 and 164 of the IC 16 via bond wires. Therefore, 163-163', 161-161', 164-164', and the medium or air among them form another set of coplanar waveguide, which inclinedly introduces the wave into the IC 16. Similarly, 165-165', 162-162', and 166-166' also form a set of coplanar waveguide which introduce the wave outside the IC 16.

Figure 6:
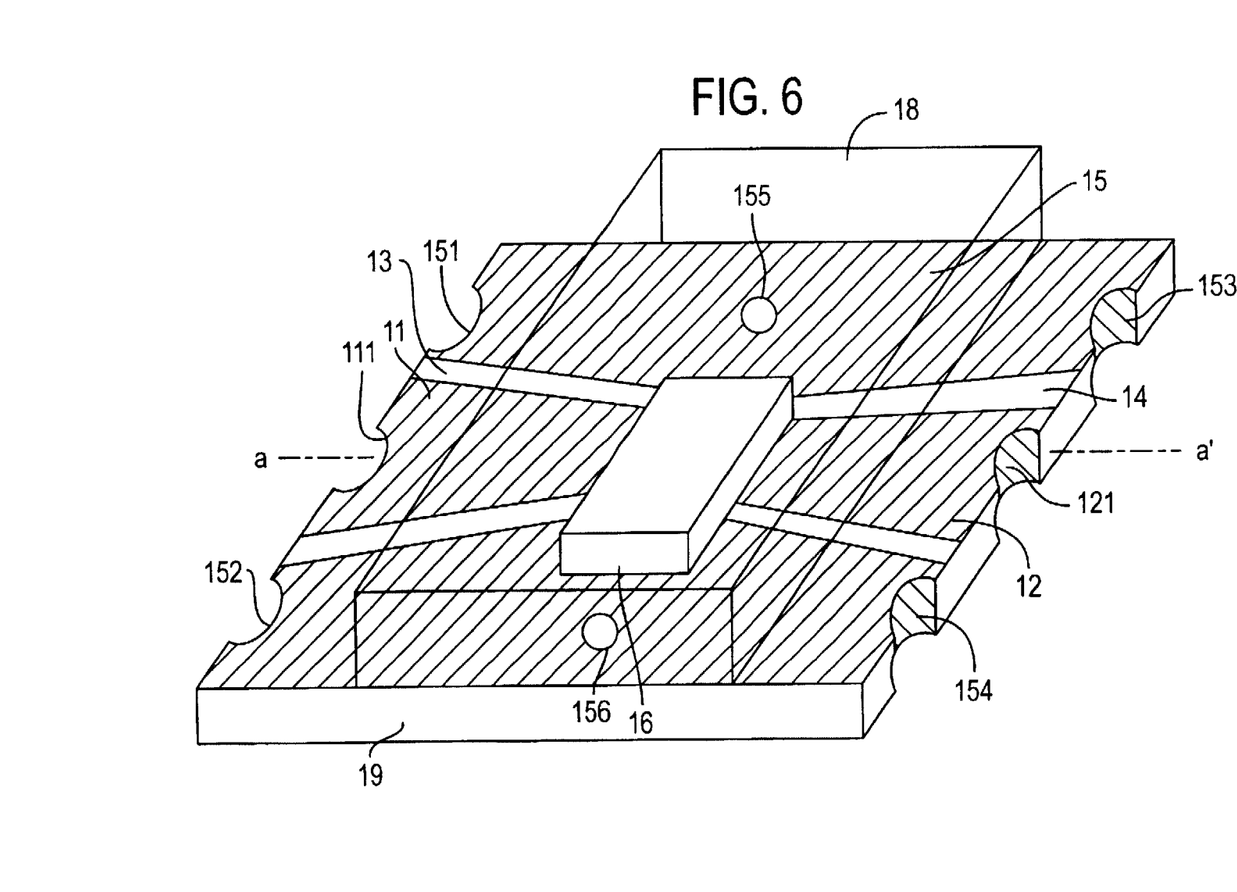
FIG. 6 shows the top view of another flip-chip embodiment of the dual-mode microwave/millimeter wave IC package according to the present invention.

FIG. 6 shows another IC package of the invention, the so-called flip-chip, formed by modifying the IC package shown in FIG. 1. Turning the IC 16 upside down at first, both the signal terminal and the ground terminal are located on the bottom surface. Next, the width of metal strips 11 and 12 are lengthened in a-a' direction such that the central portion of the area covered by the IC 16 is located on the metal area 15, the left side of said area is located on the metal strip 11, the right side is located on the metal strip 12, and no via hole is covered by the IC 16. The signal input terminal of IC 16 contacts with the metal strip 11, the signal output terminal contacts with the metal strip 12, and all the ground terminals contact with the metal area 15; the portion on metal area 15 which is covered by the IC 16 is properly etched to prevent the surface circuit of IC 16 from short-circuiting. The flip-chip not only retrenches bond wires but also avoids the aforesaid slight discontinuity, thus shows better transfer characteristics.

Figure 7:
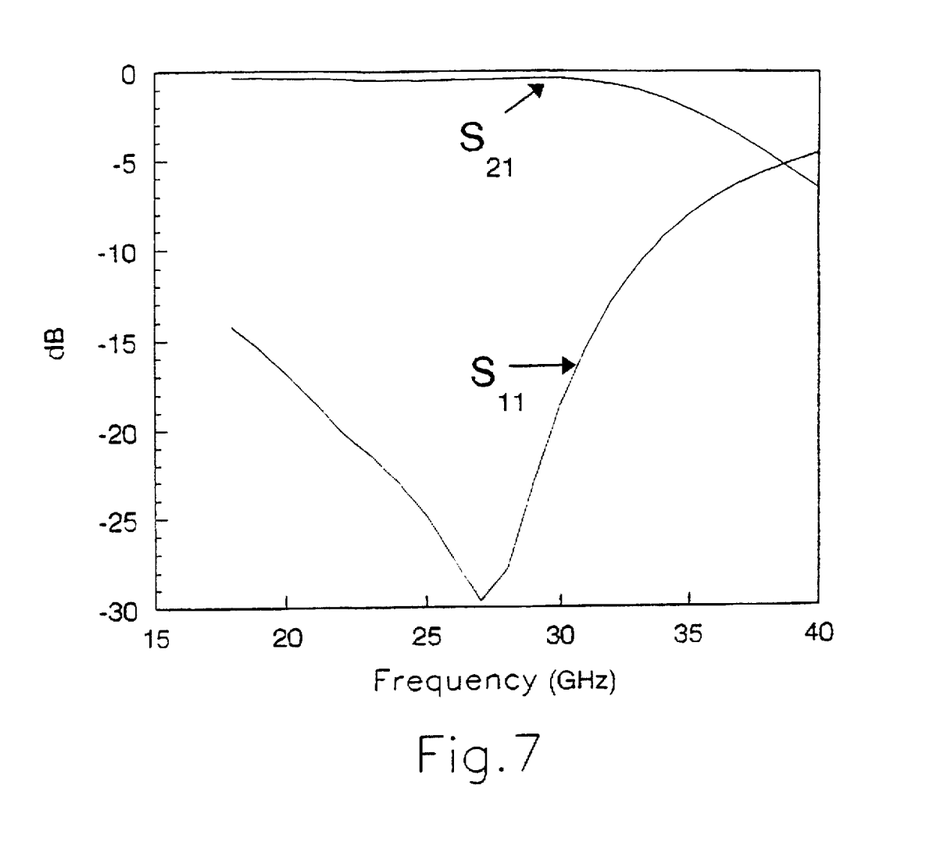
FIGS. 7 and 8, respectively, show the measured reflected and transmited signals, under microstrip mode and coplanar waveguide mode, of the IC package through line according to the present invention.
Figure 8:
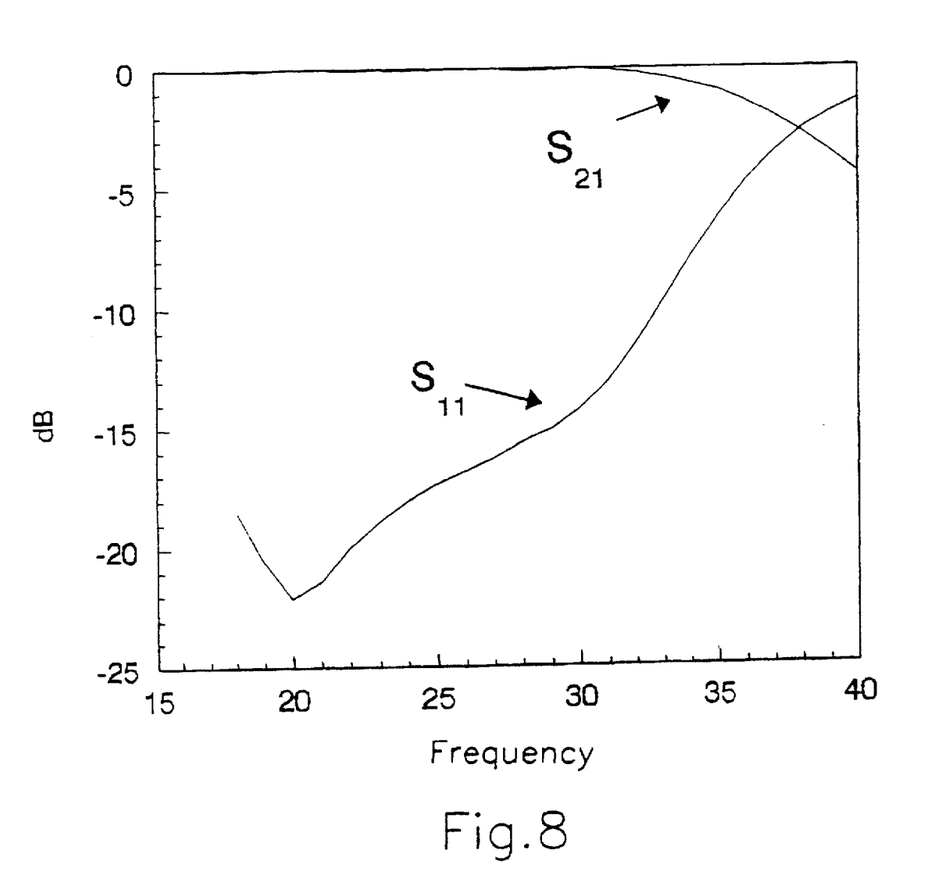

FIGS. 7 and 8 show the experimental results of the IC package according to the present invention, wherein the substrate used has a size of 2.5 mm×3.2 mm. Specifically, the two-port scattering parameter values (dB) under microstrip mode and coplanar waveguide mode are shown in FIGS. 7 and 8, respectively. Notice that the input terminals and output terminals of IC 16 are connected under the "through line" condition. Taking FIG. 1 as an example, the signal terminals 161 and 162 is connected by a shortest line (short-circuit), and the ground terminal pairs (163, 167), (167, 165), (164, 168), and (168, 166) are also connected by the shortest lines, respectively. Although the size of the aforesaid substrate is quite large, one can realize from FIGS. 7 and 8 that the IC package of the present invention still shows good microwave package characteristics. These microwave package characteristics include: (1) the input terminal reflection coefficient $S_{11}$ is below −15 dB within the operating frequency range up to 30 GHz, which means that the reflected signal is quite little; (2) the transmission coefficient $S_{21}$ remains higher than −1 dB within the operating frequency range up to 30 GHz, which means that most of the signal has been faithfully transmitted through the IC 16. By comparing the two operation modes, one can find that the transmission loss under microstrip mode is a little more than that under the coplanar waveguide mode. It is confirmed experimentally that the IC package according to the present invention can successfully adopt both microstrip and coplanar waveguide modes within a very wide frequency range (up to 30 GHz) as shown in FIGS. 7 and 8.

Figure 9:
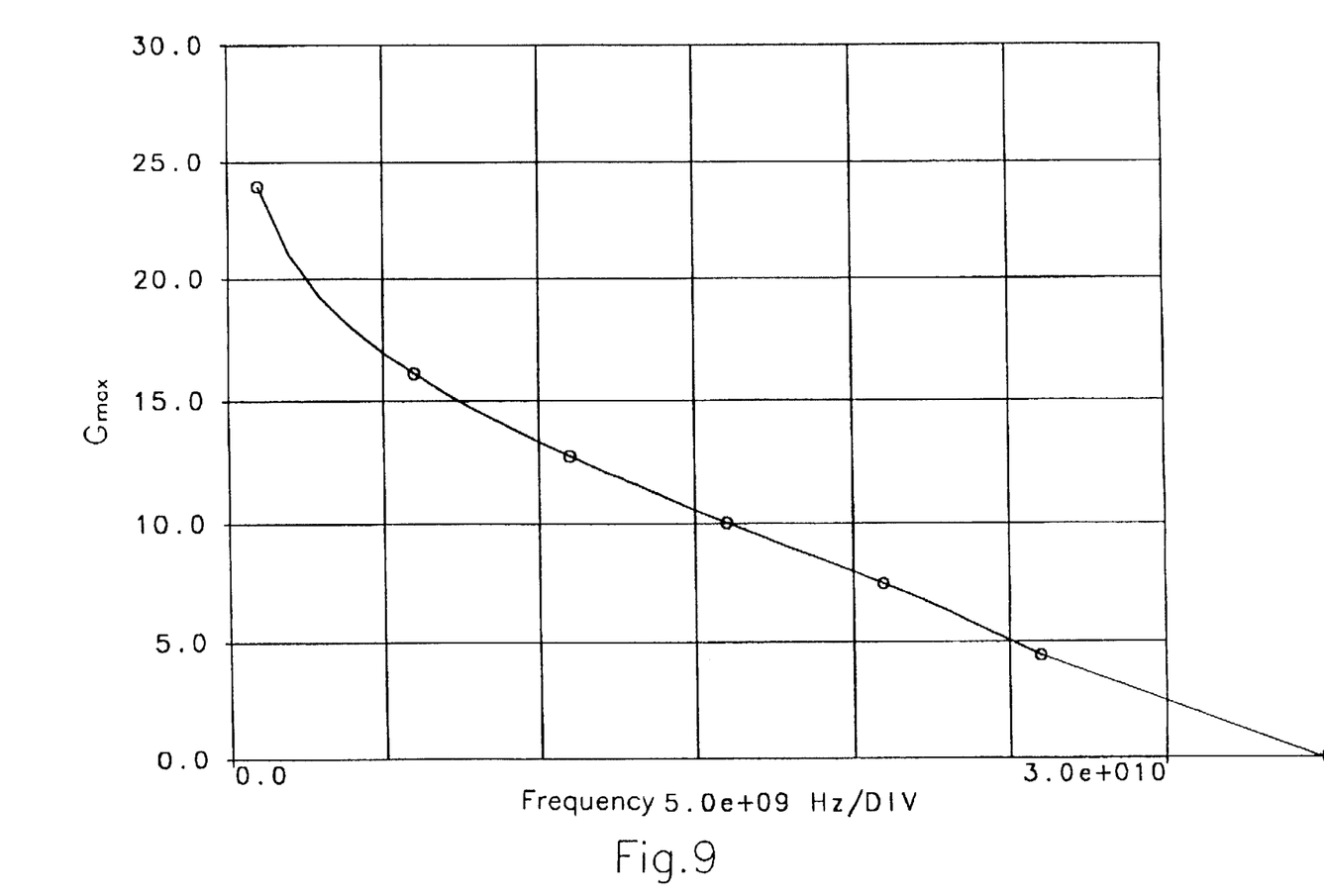
FIG. 9 is a graph showing the change of the measured maximum gain $G_{max}$ of the transistor with respect to the frequency when using a typical transistor as the IC 16.

In FIG. 9, a typical 0.25 μm GaAs PHEMT (Pseudomorphic High Electron Mobility Transistor) is used as the IC 16 which is inserted into the substrate with the aforesaid size, the common-source two-port discrete parameter is examined, the measured scattering parameters are then converted into the maximum gain value $G_{max}$. FIG. 9 shows the $G_{max}$ curve with respect to frequency, the slope of the curve corresponds to the theoretical value of −6 dB/octave, extending the curve by extrapolation also shows that the $f_{max}$ is nearly 35 GHz corresponding to $G_{max}$ of 0 dB. This shows that the IC package according to the present invention can work well with the existing microwave/millimeter wave semiconductor extending the operating frequency up to millimeter band after packaging.

The examples and embodiments described in the description are only illustrative and are not to be construed as limiting the invention. Various modifications and applications can be made without departing from the true spirit and scope of the invention as defined by the appended claims.

I claim:

1. A dual-mode microwave/millimeter wave integrated circuit package comprising a top surface, a bottom surface, and a substrate between said top and bottom surfaces, said top surface including:

an upper left metal strip and an upper right metal strip distributed in zonal areas which extend a distance from the substantially central site of the left edge and the right edge of said top surface, respectively, to the center of said top surface; said left metal strip and right metal strip being connected to said bottom surface through via holes positioned at the left and right edges of said top surface;

a left insulating strip and a right insulating strip located outside said upper left metal strip and upper right metal strip, both of them being spindling and their dimensions being small;

an upper middle metal strip area located on the rest portion of said top surface other than said upper left metal strip, said upper right metal strip, said left insulating strip, and said right insulating strip; said middle metal strip being connected to the bottom surface through via holes which are positioned in the upper and lower side of left edge of said top surface, the upper and lower side of right edge of said top surface, and the substantially central portion in horizontal direction, respectively;

an IC chip placed in the substantially central site, the whole region covered by said IC chip falling into the upper middle metal area without blanketing any via hole; the signal terminals and the ground terminals being located on the top surface of said chip, and said top surface being connected to said upper left metal strip, upper right metal strip, and upper middle metal area through a plurality of bond wires;

an encapsulant covering said IC chip and said bond wires to fix said IC chip;

an injection mold formed above said encapsulant;

said bottom surface including:

a first, a second and a third lower left metal strips distributed in zonal areas which extend a distance from the lower, middle, and upper sides of the left edge of said bottom surface to the right side of said bottom surface, said metal strips being connected to said upper middle metal area, upper left metal strip, and upper middle metal area through via holes, respectively;

a first, a second, and a third lower right metal strips distributed in zonal areas which extend a distance from the lower, middle, and upper side of the right edge of said bottom surface to the left side of said bottom surface, said metal strips being connected to said upper middle metal area, upper right metal strip, and upper middle metal area through via holes, respectively;

a lower middle metal area located on the substantially central site between the upper edge and lower edge, and being connected to said upper middle metal area through via holes.

2. The dual-mode microwave/millimeter wave integrated circuit package as described in claim 1 wherein said upper middle metal area is connected to said lower middle metal area through two via holes.

3. The dual-mode microwave/millimeter wave integrated circuit package as described in claim 1 wherein said bond wires of said IC chip can be categorized into three types: (1) signal input bond wires which connect the signal input terminal of said IC chip to the nearest points on said upper left metal strip; (2) signal output bond wires which connect the signal output terminal of said IC chip to the nearest points of said upper right metal strip; (3) ground bond wires which connect the ground terminal of said IC chip to the points on said upper middle metal area which is the nearest point to the bonding point of said upper left metal strip or right metal strip.

4. The dual-mode microwave/millimeter wave integrated circuit package as described in claim 3 wherein said ground bond wires further contain another type of bond wires which connect said ground terminal of the upper surface of said IC chip to said upper middle metal area with the shortest bond wires.

5. The dual-mode microwave/millimeter wave integrated circuit package as described in claim 1 wherein said substrate is multi-layer constructed, thereon circuit can be arranged, and said multi-layer structure can be combined with said IC chip through said via holes to form a module.

6. A dual-mode microwave/millimeter wave integrated circuit package comprising a top surface, a bottom surface, and a substrate between said top and bottom surfaces, said top surface including:

an upper left metal strip and an upper right metal strip distributed in zonal areas which extend a distance from the substantially central site of the left edge and the right edge, respectively, of said top surface toward the center of said top surface, said left metal strip and right metal strip being connected to said bottom surface through via holes positioned at the left and right edges, respectively, of said top surface;

a left insulating strip and a right insulating strip located outside said upper left metal strip and upper right metal strip, both of them being spindling and their dimensions being small;

an upper middle metal strip area located on the rest portion of said top surface other than said upper left metal strip, said upper right metal strip, said left insulating strip, and said right insulating strip; said middle metal strip being connected to the bottom surface through via holes which are positioned in the upper and lower side of left edge of said top surface, the upper and lower side of right edge of said top surface, and the substantially central portion in horizontal direction, respectively;

an IC chip flipped on the substantially central site of said top surface with the signal and ground terminal of said chip located on the bottom surface of said chip, the central portion of the region covered by said IC being located on said upper middle metal area, the left side of said region being located on said upper left metal strip, the right side being located on said upper right metal strip, and no via hole being covered by said IC chip; the signal input terminal of said IC chip contacting with said upper left metal strip, the signal output terminal contacting with said upper right metal strip, and all said ground terminals contacting with said upper central metal area; the portion on said upper central metal area which is covered by said IC chip being properly etched to prevent the surface circuit of said IC chip from short-circuiting;

an encapsulant covering said IC chip to fix said IC chip;

an injection mold formed above said encapsulant;

said bottom surface including:

a first, a second and a third lower left metal strips distributed in zonal areas which extend a distance from lower, middle, and upper sides of the left edge of said bottom surface to the right side of said bottom surface, these metal strips being connected to said upper middle metal area, upper left metal strip, and upper middle metal area through via holes, respectively;

a first, a second, and a third lower right metal strips distributed in zonal areas which extend a distance from the lower, middle, and upper side of the right edge of said bottom surface to the left side of said bottom surface, these metal strips being connected to said upper middle metal area, upper right metal strip, and upper middle metal area through via holes, respectively;

a lower middle metal area located on the substantially central site between the upper and lower edge of said bottom surface in a horizontal direction and being connected to said upper middle metal area through via holes.

7. The dual-mode microwave/millimeter wave integrated circuit package as described in claim 6 wherein said upper middle metal area is connected to said lower middle metal area through two via holes.

8. The dual-mode microwave/millimeter wave integrated circuit package as described in claim 6 wherein said signal input terminal of said IC chip contacts with said upper left metal strip, said signal output terminal contacts with said upper right metal strip, and all of said ground terminals contact with said upper middle metal area.

9. The dual-mode microwave/millimeter wave integrated circuit package as described in claim 6 wherein said substrate is multi-layer constructed, thereon circuit can be arranged, and said multi-layer structure can be combined with said IC chip through said via holes to form a module.

* * * * *